US012603615B2

(12) United States Patent
Cai et al.

(10) Patent No.: US 12,603,615 B2
(45) Date of Patent: Apr. 14, 2026

(54) BROADBAND DOHERTY POWER AMPLIFIER AND IMPLEMENTATION METHOD THEREOF

(71) Applicant: LANSUS TECHNOLOGIES INC., Shenzhen (CN)

(72) Inventors: Liyuan Cai, Shenzhen (CN); Kai Xuan, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 438 days.

(21) Appl. No.: 18/132,426

(22) Filed: Apr. 10, 2023

(65) Prior Publication Data
US 2023/0246597 A1 Aug. 3, 2023

Related U.S. Application Data

(63) Continuation of application No. PCT/CN2022/108110, filed on Jul. 27, 2022.

(30) Foreign Application Priority Data

Sep. 23, 2021 (CN) .......................... 202111118024.3

(51) Int. Cl.
$H03F\ 1/02$ (2006.01)
$H03F\ 1/42$ (2006.01)
$H03F\ 3/24$ (2006.01)

(52) U.S. Cl.
CPC ............. *H03F 1/0288* (2013.01); *H03F 1/42* (2013.01); *H03F 3/245* (2013.01);
(Continued)

(58) Field of Classification Search
CPC .......... H03F 1/0288; H03F 1/42; H03F 3/245; H03F 2200/222; H03F 2200/36; H03F 2200/387; H03F 2200/451
(Continued)

(56) References Cited

U.S. PATENT DOCUMENTS

| | | | |
|---|---|---|---|
| 2014/0152389 A1 | 6/2014 | Hamparian | |
| 2015/0188504 A1 | 7/2015 | Åkesson | |

(Continued)

FOREIGN PATENT DOCUMENTS

| | | |
|---|---|---|
| CN | 106411265 A | 2/2017 |
| CN | 107508560 A | 12/2017 |

(Continued)

OTHER PUBLICATIONS

Shi et al., "The Influence of the Output Impedances of Peaking Power Amplifier on Broadband Doherty Amplifiers", IEEE Transactions on Microwave Theory and Techniques, vol. 65, No. 8, Aug. 2017, pp. 3002-3013 (Year: 2017).*

(Continued)

*Primary Examiner* — Hafizur Rahman

(57) ABSTRACT

A broadband Doherty power amplifier is provided, which includes a power divider, a carrier power amplifier circuit, a peak power amplifier circuit, and a load modulation network. The carrier power amplifier circuit includes a carrier input matching circuit, a carrier power amplifier, and a carrier output matching circuit. The peak power amplifier circuit includes a peak input matching circuit, a peak power amplifier and a peak output matching circuit. A resistance value of a system load is $Z_L$. An output impedance of the carrier output matching circuit is $Z_m$ and meets $Z_m=Z_L(n+1)$. An output impedance of the peak output matching circuit is $Z_p$ and meets $Z_p=Z_L(n+1)/n$. The load modulation network is configured to set an impedance of a combination point to be (Continued)

$Z_O$, whose resistance value is $Z_L$. A method of implementing a broadband Doherty power amplifier is further provided.

10 Claims, 4 Drawing Sheets

(52) U.S. Cl.
CPC .... *H03F 2200/222* (2013.01); *H03F 2200/36* (2013.01); *H03F 2200/387* (2013.01); *H03F 2200/451* (2013.01)

(58) Field of Classification Search
USPC ........................................................ 330/295
See application file for complete search history.

(56) References Cited

U.S. PATENT DOCUMENTS

| | | | |
|---|---|---|---|
| 2017/0126181 | A1 | 5/2017 | Embar |
| 2021/0013839 | A1 | 1/2021 | Wang |

FOREIGN PATENT DOCUMENTS

| | | | | | |
|---|---|---|---|---|---|
| CN | 107733372 | A | | 2/2018 | |
| CN | 109650212 | A | | 4/2018 | |
| CN | 106411265 | B | * | 3/2019 | .............. H03F 3/211 |
| CN | 113258881 | A | | 8/2021 | |
| CN | 113904628 | A | | 1/2022 | |
| EP | 2887541 | A1 | | 6/2015 | |
| JP | 2006166141 | A | | 6/2006 | |
| WO | 2008035396 | A1 | | 3/2008 | |

OTHER PUBLICATIONS

Marki Microwave, "Microwave Power Dividers and Couplers Tutorial Overview and Definition of Terms", 2013 (Year: 2013).*

International Search Report issued in corresponding International application No. PCT/CN2022/108110, mailed Sep. 27, 2022(5 pages).

Written Opinion of the International Search Authority in corresponding International application No. PCT/CN2022/108110. mailed Sep. 27, 2022(7 pages).

Japanese Notice of Reasons for Refusal, Japanese Patent Application No. 2023-536512, mailed May 7, 2024. (11 pages).

European Search Report, European Application No. 22871171.9, mailed Apr. 19, 2024. (13 pages).

* cited by examiner

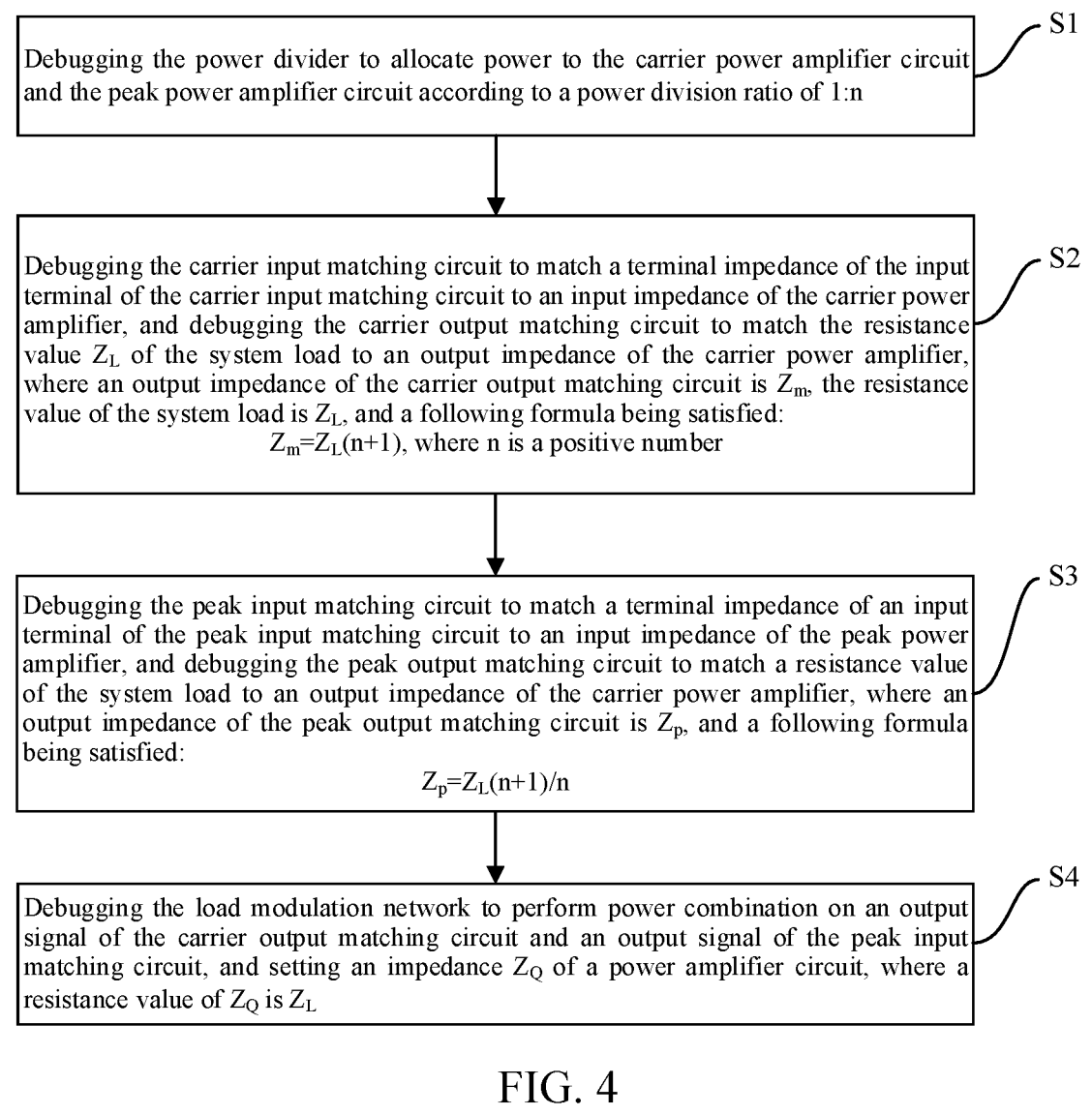

Debugging the power divider to allocate power to the carrier power amplifier circuit and the peak power amplifier circuit according to a power division ratio of 1:n — S1

Debugging the carrier input matching circuit to match a terminal impedance of the input terminal of the carrier input matching circuit to an input impedance of the carrier power amplifier, and debugging the carrier output matching circuit to match the resistance value $Z_L$ of the system load to an output impedance of the carrier power amplifier, where an output impedance of the carrier output matching circuit is $Z_m$, the resistance value of the system load is $Z_L$, and a following formula being satisfied:
$$Z_m = Z_L(n+1), \text{ where n is a positive number}$$
— S2

Debugging the peak input matching circuit to match a terminal impedance of an input terminal of the peak input matching circuit to an input impedance of the peak power amplifier, and debugging the peak output matching circuit to match a resistance value of the system load to an output impedance of the carrier power amplifier, where an output impedance of the peak output matching circuit is $Z_p$, and a following formula being satisfied:
$$Z_p = Z_L(n+1)/n$$
— S3

Debugging the load modulation network to perform power combination on an output signal of the carrier output matching circuit and an output signal of the peak input matching circuit, and setting an impedance $Z_Q$ of a power amplifier circuit, where a resistance value of $Z_Q$ is $Z_L$ — S4

FIG. 4

BROADBAND DOHERTY POWER AMPLIFIER AND IMPLEMENTATION METHOD THEREOF

TECHNICAL FIELD

The present disclosure relates to the technical field of circuits, and in particular to a broadband Doherty power amplifier and an implementation method for a broadband Doherty power amplifier.

BACKGROUND

Currently, with the development of wireless communication technology, especially the widely use of fifth generation communication technology, radio frequency power amplifiers are more and more important in a mobile phone communication system since performance of the radio frequency power amplifiers greatly affects working states of the wireless communication system. As the communication technology advances, a modulation signal shows characteristics of a high peak-to-average ratio. The emergence of the fifth generation communication technology puts forward higher requirements on bandwidths of power amplifiers. Therefore, the radio frequency power amplifiers used in the fifth generation communication technology are generally a high-efficiency broadband Doherty power amplifier.

In the related art, the broadband Doherty power amplifier typically includes a power divider, a carrier power amplifier circuit, a peak power amplifier circuit, and a load modulation network. The carrier power amplifier circuit includes a carrier input matching circuit, a carrier power amplifier, and a carrier output matching circuit sequentially connected in series. The peak power amplifier circuit includes a peak input matching circuit, a peak power amplifier, and a peak output matching circuit sequentially connected in series. Referring to FIG. 1, FIG. 1 illustrates the broadband Doherty power amplifier in the related art. An input terminal of the carrier power amplifier circuit, an input terminal of the peak power amplifier circuit, and the load modulation network each uses a quarter-wave impedance transformation line.

However, impedance transformation lines in the related art limit operating bandwidths of the power amplifiers, so that the power amplifiers each only has a narrow operating bandwidth, which fails to provide large bandwidth for the fifth generation communication system. Therefore, in the related art, a quarter-wave impedance transformation ratio is reduced, and an equivalent impedance transformer circuit is used to replace a quarter wavelength for impedance transformation, or a load modulation structure having no transmission line is used to remove the quarter-wave impedance transformation line. These two solutions in the related art widen the bandwidth to a certain extent, but increase complexity of the power amplifier circuit.

Therefore, it is necessary to provide a novel broadband Doherty power amplifier and an implementation method to solve the foregoing problems.

SUMMARY

In view of shortcomings in the related art, the present disclosure provides a broadband Doherty power amplifier and an implementation method for a broadband Doherty power amplifier, which allows a load modulation network structure to remove a quarter-wave impedance transformation line after combination point, thereby realizing a simple circuit structure and a high operating bandwidth.

In order to solve the foregoing problems, in a first aspect, one embodiment of the present disclosure provides a broadband Doherty power amplifier, including a power divider, a carrier power amplifier circuit, a peak power amplifier circuit, and a load modulation network. An input terminal of the power divider serves as an input terminal of the broadband Doherty power amplifier, two output terminals of the power divider are respectively connected to an input terminal of the carrier power amplifier circuit and an input terminal of the peak power amplifier circuit, an output terminal of the carrier power amplifier circuit is connected to a first input terminal of the load modulation network, an output terminal of the peak power amplifier circuit is connected to a second input terminal of the load modulation network, and an output terminal of the load modulation network serves as an output terminal of the broadband Doherty power amplifier for connecting to a system load.

The carrier power amplifier circuit includes a carrier input matching circuit, a carrier power amplifier, and a carrier output matching circuit sequentially connected in series. An input terminal of the carrier input matching circuit is connected to a first one of the two output terminals of the power divider, and an output terminal of the carrier output matching circuit is connected to the first input terminal of the load modulation network.

The peak power amplifier circuit includes a peak input matching circuit, a peak power amplifier, and a peak output matching circuit sequentially connected in series. An input terminal of the peak input matching circuit is connected to a second one of the two output terminals of the power divider, and an output terminal of the peak output matching circuit is connected to the second input terminal of the load modulation network.

A resistance value of the system load is $Z_L$.

The power divider is configured to respectively allocate power to the carrier power amplifier circuit and the peak power amplifier circuit according to a power division ratio of 1:n.

The carrier input matching circuit is configured to match a terminal impedance of the input terminal of the carrier input matching circuit to an input impedance of the carrier power amplifier, the carrier output matching circuit is configured to match the resistance value $Z_L$ of the system load to an output impedance of the carrier power amplifier. An output impedance of the carrier output matching circuit is $Z_m$, and a following formula is satisfied:

$$Z_m = Z_L(n+1); \text{ and } n \text{ is a positive number.}$$

The peak input matching circuit is configured to match a terminal impedance of the input terminal of the peak input matching circuit to an input impedance of the peak power amplifier, the peak output matching circuit is configured to match the resistance value $Z_L$ of the system load to an output impedance of the carrier power amplifier. An output impedance of the peak output matching circuit is $Z_p$, and a following formula is satisfied:

$$Z_p = Z_L(n+1)/n.$$

The load modulation network is configured to perform power combination on an output signal of the carrier output matching circuit and an output signal of the peak input matching circuit, and is configured to set an impedance $Z_Q$ of a power amplifier combination point, where a resistance value of the impedance $Z_Q$ is $Z_L$.

Optionally, the resistance value $Z_L$ of the system load is 50 ohms.

Optionally, the power division ratio is 1:1.5, a resistance value of $Z_m$ is 125 ohms, a resistance value of $Z_p$ is 83.3 ohms, and the resistance value of the impedance $Z_Q$ is 50 ohms.

Optionally, the carrier power amplifier circuit is a class AB power amplifier.

Optionally, the carrier power amplifier circuit is implemented by a transistor.

Optionally, the peak power amplifier circuit is a class C power amplifier.

Optionally, the peak power amplifier circuit is implemented by a transistor.

Optionally, the power divider is an in-phase power divider or a phase quadrature power divider.

Optionally, the carrier input matching circuit and the peak input matching circuit each includes a corresponding phase compensation circuit.

In a second aspect, one embodiment of the present disclosure further provides an implementation method for a broadband Doherty power amplifier. The broadband Doherty power amplifier includes a power divider, a carrier power amplifier circuit, a peak power amplifier circuit, and a load modulation network. An input terminal of the power divider serves as an input terminal of the broadband Doherty power amplifier, two output terminals of the power divider are respectively connected to an input terminal of the carrier power amplifier circuit and an input terminal of the peak power amplifier circuit, an output terminal of the carrier power amplifier circuit is connected to a first input terminal of the load modulation network, an output terminal of the peak power amplifier circuit is connected to a second input terminal of the load modulation network, and an output terminal of the load modulation network serves as an output terminal of the broadband Doherty power amplifier for connecting to a system load.

The carrier power amplifier circuit includes a carrier input matching circuit, a carrier power amplifier, and a carrier output matching circuit sequentially connected in series. An input terminal of the carrier input matching circuit is connected to a first one of the two output terminals of the power divider, and an output terminal of the carrier output matching circuit is connected to the first input terminal of the load modulation network.

The peak power amplifier circuit includes a peak input matching circuit, a peak power amplifier, and a peak output matching circuit sequentially connected in series. An input terminal of the peak input matching circuit is connected to a second one of the two output terminals of the power divider, and an output terminal of the peak output matching circuit is connected to the second input terminal of the load modulation network. The method implementation includes the following steps:

S1. debugging the power divider to allocate power to the carrier power amplifier circuit and the peak power amplifier circuit according to a power division ratio of 1:n;

S2. debugging the carrier input matching circuit to match a terminal impedance of the input terminal of the carrier input matching circuit to an input impedance of the carrier power amplifier, and debugging the carrier output matching circuit to match the resistance value $Z_L$ of the system load to an output impedance of the carrier power amplifier, where an output impedance of the carrier output matching circuit is $Z_m$, the resistance value of the system load is $Z_L$, and a following formula being satisfied:

$$Z_m=Z_L(n+1); \text{ where } n \text{ is a positive number;}$$

S3. debugging the peak input matching circuit to match a terminal impedance of an input terminal of the peak input matching circuit to an input impedance of the peak power amplifier, and debugging the peak output matching circuit to match a resistance value of the system load to an output impedance of the carrier power amplifier, where an output impedance of the peak output matching circuit is $Z_p$, and a following formula being satisfied:

$$Z_p=Z_L(n+1)/n; \text{ and}$$

S4. debugging the load modulation network to perform power combination on an output signal of the carrier output matching circuit and an output signal of the peak input matching circuit, and setting an impedance $Z_Q$ of a power amplifier circuit, where a resistance value of $Z_Q$ is $Z_L$.

Compared with the related art, according to the broadband Doherty power amplifier and the implementation method for the broadband Doherty power amplifier provided by the present disclosure, the carrier input matching circuit matches the terminal impedance of its input terminal to the input impedance of the carrier power amplifier, and the peak input matching circuit matches the terminal impedance of its input terminal to the input impedance of the peak power amplifier. Moreover, the load modulation network performs power combination on the output signal of the carrier output matching circuit and the output signal of the peak input matching circuit, and the impedance of the power amplifier combination point is set to be equal to the resistance value of the system load, so that the load modulation network structure can remove the quarter-wave impedance transformation line after the combination point, which allows the broadband Doherty power amplifier to have a simple circuit structure and a high operating bandwidth.

BRIEF DESCRIPTION OF THE DRAWINGS

The present disclosure is described below with reference to accompanying drawings. In conjunction with the accompanying drawings, the foregoing or other aspects of the present disclosure is made clearer and more readily understood. In the drawings:

FIG. 4 is a schematic flowchart of an implementation method for a broadband Doherty power amplifier according to one embodiment of the present disclosure.

DETAILED DESCRIPTION OF THE EMBODIMENTS

Specific embodiments of the present disclosure are described in details below with reference to the accompanying drawings.

The specific embodiments described herein are specific implementations of the present disclosure, and are used to illustrate concepts of the present disclosure, which are explanatory and exemplary, and should not be interpreted as limiting implementations and scopes of the present disclosure. In addition to the embodiments described herein, based on contents disclosed in the claims and specifications of the present disclosure, those skilled in the art can adopt other technical solutions. Any substitution or modification made to the embodiments described herein is within the protection scope of the present disclosure.

The present disclosure provides a broadband Doherty power amplifier 100.

Figure 1:
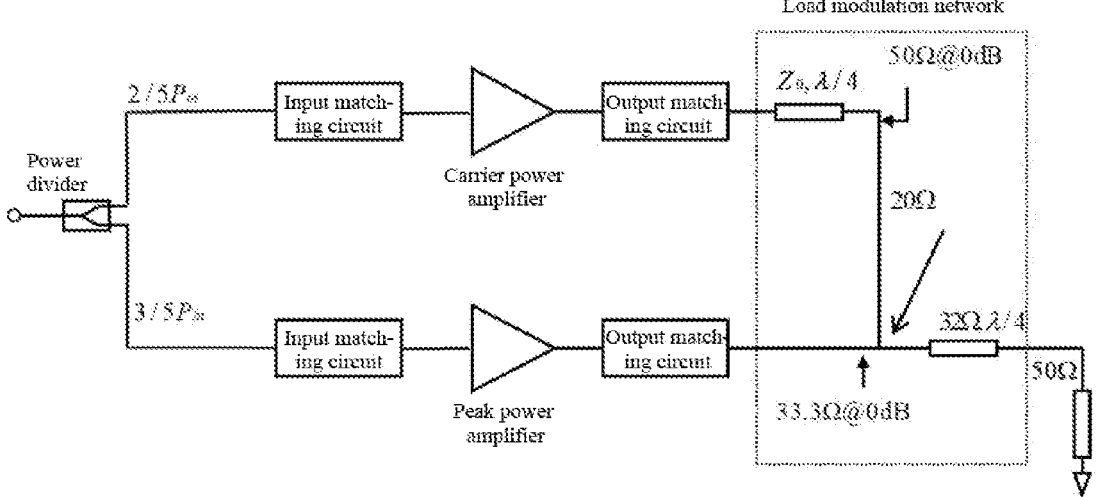
FIG. 1 is a structural schematic diagram of an application circuit of an asymmetric Doherty power amplifier in the related technology.
Figure 2:
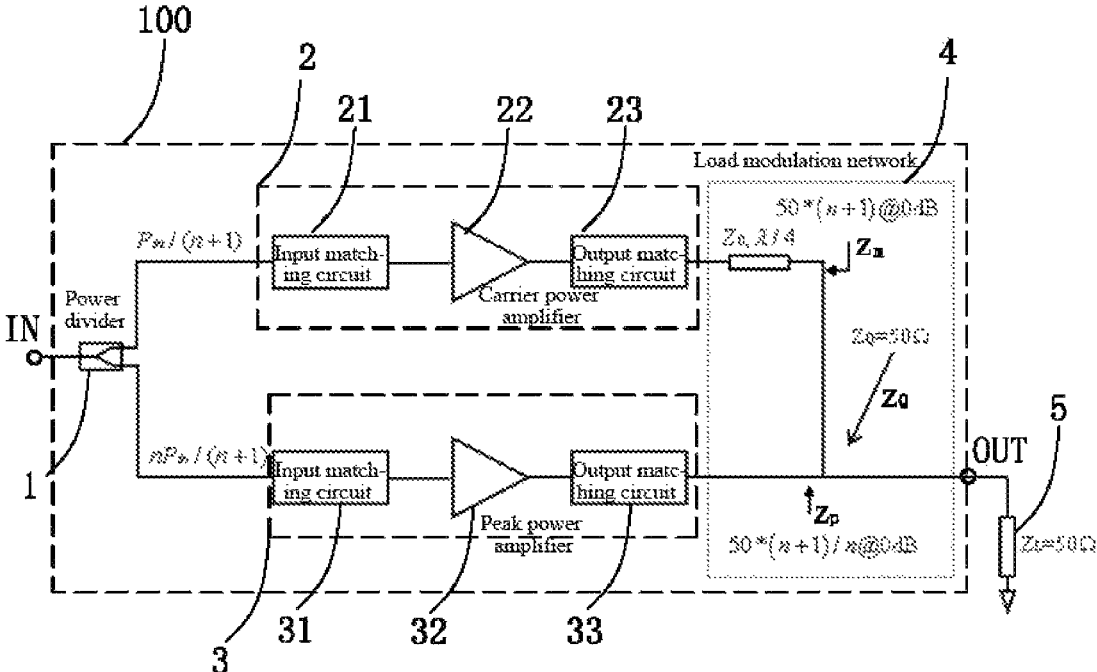
FIG. 2 is a structural schematic diagram of an application circuit of a broadband Doherty power amplifier according to the present disclosure.

Referring to FIG. 2, FIG. 2 is a structural schematic diagram of an application circuit of a broadband Doherty power amplifier according to the present disclosure.

In circuit applications, the broadband Doherty power amplifier 100 is connected to a system load 5. The system load 5 has a resistance value $Z_L$. In this embodiment, the resistance value $Z_L$ of the system load 5 is 50 ohms.

Specifically, the broadband Doherty power amplifier 100 includes a power divider 1, a carrier power amplifier circuit 2, a peak power amplifier circuit 3, and a load modulation network 4.

The power divider 1 is configured to respectively allocate power to the carrier power amplifier circuit 2 and the peak power amplifier circuit 3 according to a power division ratio of 1:n. The power divider 1 determines a specific power division ratio according to the requirement of a modulation signal of the broadband Doherty power amplifier 100. In one embodiment, the power divider 1 is an in-phase power divider or a phase quadrature power divider.

The carrier power amplifier circuit 2 is a class AB power amplifier. In one embodiment, the carrier power amplifier circuit 2 is implemented by a transistor. Specifically, the carrier power amplifier circuit 2 includes a carrier input matching circuit 21, a carrier power amplifier 22, and a carrier output matching circuit 23 sequentially connected in series.

The carrier input matching circuit 21 is configured to match a terminal impedance of its input terminal to an input impedance of the carrier power amplifier 22.

The carrier output matching circuit 23 is configured to match the resistance value $Z_L$ of the system load to an output impedance of the carrier power amplifier 22. An output impedance of the carrier output matching circuit 23 is $Z_m$, and a following formula is satisfied:

$$Z_m = Z_L(n+1);$$

Specifically, n is a positive number.

In one embodiment, a corresponding phase compensation circuit is disposed in the carrier input matching circuit 21.

The peak power amplifier circuit 3 is a class C power amplifier. In one embodiment, the peak power amplifier circuit 3 is implemented by a transistor. The peak power amplifier circuit 3 includes a peak input matching circuit 31, a peak power amplifier 32, and a peak output matching circuit 33 sequentially connected in series.

The peak input matching circuit 31 is configured to match a terminal impedance of its input terminal to an input impedance of the peak power amplifier 32.

The peak output matching circuit 33 is configured to match the resistance value $Z_L$ of the system load to an output impedance of the carrier power amplifier 32. An output impedance of the peak output matching circuit 33 is $Z_p$, and a following formula is satisfied:

$$Z_p = Z_L(n+1)/n.$$

In one embodiment, a corresponding phase compensation circuit is disposed in the peak input matching circuit 31.

The load modulation network 4 is configured to perform power combination on an output signal of the carrier output matching circuit 23 and an output signal of the peak input matching circuit 31, and is configured to set an impedance $Z_Q$ of the power amplifier combination point. The resistance value of $Z_Q$ is $Z_L$.

Specifically, the circuit connection relationship is described below.

An input terminal of the power divider 1 is served as an input terminal IN of the broadband Doherty power amplifier 100. Two output terminals of the power divider 1 are respectively connected to an input terminal of the carrier power amplifier circuit 2 and an input terminal of the peak power amplifier circuit 3.

An output terminal of the carrier power amplifier circuit 2 is connected to a first input terminal of the load modulation network 4. Specifically, the input terminal of the carrier input matching circuit 21 is connected to one output terminal of the power divider 1, and the output terminal of the carrier output matching circuit 23 is connected to the first input terminal of the load modulation network 4.

An output terminal of the peak power amplifier circuit 3 is connected to a second input terminal of the load modulation network 4. Specifically, the input terminal of the peak input matching circuit 31 is connected to the other output terminal of the power divider 1, and the output terminal of the peak output matching circuit 33 is connected to the second input terminal of the load modulation network 4.

An output terminal of the load modulation network 4 is served as an output terminal OUT of the broadband Doherty power amplifier 100 for connecting to the system load 5.

It should be noted that the power divider 1, the carrier power amplifier circuit 2, the peak power amplifier circuit 3, and the load modulation network 4 described herein are common circuits or modules used in the art. In addition, their indicators and parameters can be adjusted according to actual applications, which is not detailed herein.

The working principle of the broadband Doherty power amplifier 100 is described below.

In the case of a saturated power, the output impedance of the carrier power amplifier 22 is set to be $Z_0$. $Z_0$ is a characteristic impedance of the transmission line used in the broadband Doherty power amplifier 100. According to the power division ratio of 1:n of the power divider 1, it can be known, from the power formula $P=U^2/R$, that the ratio of the output impedance of the carrier power amplifier 22 to the output impedance of the peak power amplifier 32 is n:1. Therefore, the output impedance of the peak power amplifier 32 is $$Z_Q = \frac{Z_m * Z_p}{Z_m + Z_p} = \frac{Z_0}{n+1}.$$

In this case, the impedance of the power amplifier combination point is $Z_Q = Z_0/n$. This impedance is matched to the load $Z_L = 50\Omega$ through the quarter-wave impedance transformation line, and the impedance of the impedance transformation line is $$Z_T = \sqrt{Z_Q Z_L} = \frac{Z_0}{\sqrt{n+1}}.$$

If it is to remove the quarter-wave impedance transformation line after the combination point, the impedance value of the power amplifier combination point needs to be equal to the impedance value of the system load 5, namely 50 ohms. Therefore, the impedance of the power amplifier combination point is determined to be $Z_Q=Z_0/(n+1)=50$ ohms, where $Z_0=50(n+1)$. According to the working principle of the asymmetric Doherty power amplifier, in the case of the saturated power, the output impedance of the carrier power amplifier circuit is $Z_m-Z_0=50(n+1)$, and the output impedance of the peak power amplifier 32 is $Z_p=Z_0/n=50(n+1)/n$. Therefore, in the case that the output impedance of the carrier power amplifier 22 and the output impedance of the peak power amplifier 32 satisfy the foregoing formulas, $$Z_Q = \frac{Z_m * Z_p}{Z_m + Z_p} = \frac{Z_0}{n+1} = 50\Omega.$$

The impedance value of the power amplifier combination point is equal to the impedance value of the system load 5, so that the quarter-wave impedance transformation line can be removed, which widens the operating bandwidth of the broadband Doherty power amplifier 100. In addition, the circuit complexity is reduced, thereby reducing the loss. Moreover, the combined amplified signal is directly output to the system load 5 through the output terminal OUT of the broadband Doherty power amplifier, so that the broadband Doherty power amplifier 100 is allowed to have a simple circuit structure and a high operating bandwidth.

Figure 3:
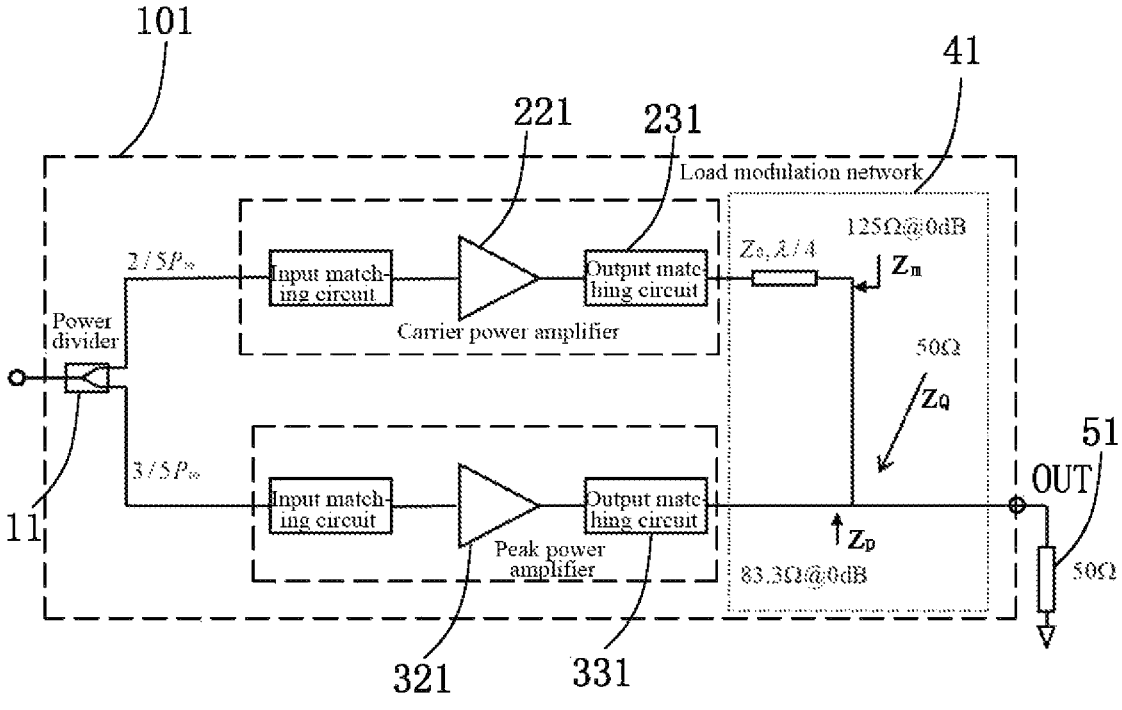
FIG. 3 is a structural schematic diagram of an application circuit of one embodiment of a broadband Doherty power amplifier according to the present disclosure.

In the following, one embodiment is described as an example. Referring to FIG. 3, FIG. 3 is a schematic structural diagram of an application circuit of an embodiment of a broadband Doherty power amplifier according to the present disclosure. In this embodiment, the power divider 11 of the broadband Doherty power amplifier 101 has a power division ratio of 1:1.5. The output impedance $Z_m$ of the carrier output matching circuit 231 has a resistance value of 125 ohms. The output impedance $Z_p$ of the peak output matching circuit 331 has a resistance value of 83.3 ohms. In the case that the output impedance of the carrier power amplifier 221 and the output impedance of the peak power amplifier 321 meet the foregoing equations, the resistance value of $Z_Q$ is 50 ohms. The broadband Doherty power amplifier 101 directly outputs the combined amplified signal to the system load 51 with the resistance value of 50 ohms through its output terminal OUT. Therefore, the broadband Doherty power amplifier 101 can remove the quarter-wave impedance transformation line, thereby widening the operating bandwidth of the broadband Doherty power amplifier 101. In addition, the circuit complexity is reduced, thereby reducing the loss.

The present disclosure further provides an implementation method for a broadband Doherty power amplifier. The method is applied to the broadband Doherty power amplifier 100.

In circuit applications, the broadband Doherty power amplifier 100 is connected to a system load 5. The system load 5 has a resistance value $Z_L$. In this embodiment, the resistance value $Z_L$ of the system load 5 is 50 ohms.

Specifically, the broadband Doherty power amplifier 100 includes a power divider 1, a carrier power amplifier circuit 2, a peak power amplifier circuit 3, and a load modulation network 4.

The power divider 1 is configured to respectively allocate power to the carrier power amplifier circuit 2 and the peak power amplifier circuit 3 according to a power division ratio of 1:n. The power divider 1 determines a specific power division ratio according to the requirement of a modulation signal of the broadband Doherty power amplifier 100. In an embodiment, the power divider 1 is an in-phase power divider or a phase quadrature power divider.

The carrier power amplifier circuit 2 is a class AB power amplifier. In an embodiment, the carrier power amplifier circuit 2 is implemented by a transistor. Specifically, the carrier power amplifier circuit 2 includes a carrier input matching circuit 21, a carrier power amplifier 22, and a carrier output matching circuit 23 sequentially connected in series.

The carrier input matching circuit 21 is configured to match a terminal impedance of its input terminal to an input impedance of the carrier power amplifier 22.

The carrier output matching circuit 23 is configured to match the resistance value $Z_L$ of the system load to an output impedance of the carrier power amplifier 22. An output impedance of the carrier output matching circuit 23 is $Z_m$, and a following formula is satisfied:

$$Z_m=Z_L(n+1);$$

Specifically, n is a positive number.

In one embodiment, a corresponding phase compensation circuit is disposed in the carrier input matching circuit 21.

The peak power amplifier circuit 3 is a class C power amplifier. In one embodiment, the peak power amplifier circuit 3 is implemented by a transistor. The peak power amplifier circuit 3 includes a peak input matching circuit 31, a peak power amplifier 32, and a peak output matching circuit 33 sequentially connected in series.

The peak input matching circuit 31 is configured to match a terminal impedance of its input terminal to an input impedance of the peak power amplifier 32.

The peak output matching circuit 33 is configured to match the resistance value $Z_L$ of the system load to an output impedance of the carrier power amplifier 32. An output impedance of the peak output matching circuit 33 is $Z_p$, and a following formula is satisfied:

$$Z_p=Z_L(n+1)/n.$$

In one embodiment, a corresponding phase compensation circuit is disposed in the peak input matching circuit 31.

The load modulation network 4 is configured to perform power combination on an output signal of the carrier output matching circuit 23 and an output signal of the peak input matching circuit 31, and is configured to set an impedance $Z_Q$ of the power amplifier combination point. The resistance value of $Z_Q$ is $Z_L$.

Specifically, the circuit connection relationship is described below.

An input terminal of the power divider 1 is served as an input terminal IN of the broadband Doherty power amplifier. Two output terminals of the power divider 1 are connected to an input terminal of the carrier power amplifier circuit 2 and an input terminal of the peak power amplifier circuit 3 respectively.

An output terminal of the carrier power amplifier circuit 2 is connected to a first input terminal of the load modulation network 4. Specifically, the input terminal of the carrier input matching circuit 21 is connected to one output terminal of the power divider 1, and the output terminal of the carrier output matching circuit 23 is connected to the first input terminal of the load modulation network 4.

An output terminal of the peak power amplifier circuit 3 is connected to a second input terminal of the load modulation network 4. Specifically, the input terminal of the peak input matching circuit 31 is connected to the other output terminal of the power divider 1, and the output terminal of the peak output matching circuit 33 is connected to the second input terminal of the load modulation network 4.

An output terminal of the load modulation network 4 is served as an output terminal OUT of the broadband Doherty power amplifier for connecting to the system load 5.

Referring to FIG. 4, FIG. 4 is a schematic flowchart of an implementation method for a broadband Doherty power amplifier according to an embodiment of the present disclosure.

The method includes the following steps:

S1. debugging the power divider 1 to respectively allocate power to the carrier power amplifier circuit 2 and the peak power amplifier circuit 3 according to a power division ratio of 1:n.

S2. debugging the carrier input matching circuit 21 to match a terminal impedance of its input terminal to an input impedance of the carrier power amplifier 22, and debugging the carrier output matching circuit 23 to match the resistance value of the system load to an output impedance of the carrier power amplifier 22. The output impedance of the carrier output matching circuit 23 is $Z_m$, the resistance value of the system load 5 is $Z_L$, and a following formula is satisfied:

$Z_m=Z_L(n+1)$, and $n$ is a positive number.

S3. debugging the peak input matching circuit 31 to match a terminal impedance of its input terminal to an input impedance of the peak power amplifier 32, and debugging the peak output matching circuit 33 to match the resistance value $Z_L$ of the system load to an output impedance of the carrier power amplifier 32. The output impedance of the peak output matching circuit 33 is $Z_p$, and a following formula is satisfied:

$Z_p=Z_L(n+1)/n$.

S4. debugging the load modulation network 4 to perform power combination on an output signal of the carrier output matching circuit 23 and an output signal of the peak input matching circuit 31, and setting an impedance $Z_Q$ of the power amplifier combination point. The resistance value of $Z_Q$ is $Z_L$.

To sum up, through the steps of the foregoing method, the broadband Doherty power amplifier 100 is allowed to have a simple circuit structure and a high operating bandwidth.

Compared with the related art, according to the broadband Doherty power amplifier and the method of implementing the broadband Doherty power amplifier provided by the present disclosure, the carrier input matching circuit matches the terminal impedance of its input terminal to the input impedance of the carrier power amplifier, and the peak input matching circuit matches the terminal impedance of its input terminal to the input impedance of the peak power amplifier. Moreover, the load modulation network performs power combination on the output signal of the carrier output matching circuit and the output signal of the peak input matching circuit, and the impedance of the power amplifier combination point is set to be equal to the resistance value of the system load, so that the load modulation network structure can remove the quarter-wave impedance transformation line after the combination point, which allows the broadband Doherty power amplifier to have a simple circuit structure and a high operating bandwidth.

It should be noted that the embodiments described above with reference to the accompanying drawings are only used to illustrate the scope of the present disclosure and not to limit the scope of the present disclosure. Those of ordinary skill in the art should understand that modifications or equivalent substitutions to the present disclosure without departing from the spirit and scope of the present disclosure should be covered within the scope of the present disclosure. In addition, unless the context otherwise requires, words that appear in the singular include the plural, and vice versa. In addition, unless specifically stated, all or part of any embodiment may be used in conjunction with all or part of any other embodiment.

What is claimed is:

1. A broadband Doherty power amplifier, comprising:
a power divider;
a carrier power amplifier circuit;
a peak power amplifier circuit; and
a load modulation network;
wherein an input terminal of the power divider serves as an input terminal of the broadband Doherty power amplifier; two output terminals of the power divider are respectively connected to an input terminal of the carrier power amplifier circuit and an input terminal of the peak power amplifier circuit; wherein an output terminal of the carrier power amplifier circuit is connected to a first input terminal of the load modulation network; an output terminal of the peak power amplifier circuit is connected to a second input terminal of the load modulation network; and an output terminal of the load modulation network serves as an output terminal of the broadband Doherty power amplifier, for connecting to a system load;
wherein the carrier power amplifier circuit comprise a carrier input matching circuit, a carrier power amplifier, and a carrier output matching circuit that are sequentially connected in series; wherein an input terminal of the carrier input matching circuit is connected to a first one of the two output terminals of the power divider, and an output terminal of the carrier output matching circuit is connected to the first input terminal of the load modulation network;
wherein the peak power amplifier circuit comprises a peak input matching circuit, a peak power amplifier, and a peak output matching circuit that are sequentially connected in series; wherein an input terminal of the peak input matching circuit is connected to a second one of the two output terminals of the power divider, and an output terminal of the peak output matching circuit is connected to the second input terminal of the load modulation network;
wherein a resistance value of the system load is $Z_L$;
wherein the power divider is configured to respectively allocate power to the carrier power amplifier circuit and the peak power amplifier circuit according to a power division ratio of 1:n;
wherein the carrier input matching circuit is configured to match a terminal impedance of the input terminal of the carrier input matching circuit to an input impedance of the carrier power amplifier, and the carrier output matching circuit is configured to match the resistance value $Z_L$ of the system load to an output impedance of the carrier power amplifier; an output impedance of the carrier output matching circuit is $Z_m$, and a following formula is satisfied:

$Z_m=Z_L(n+1)$; wherein $n$ is a positive number;

wherein the peak input matching circuit is configured to match a terminal impedance of the input terminal of the peak input matching circuit to an input impedance of the peak power amplifier, and the peak output matching circuit is configured to match the resistance value $Z_L$ of the system load to an output impedance of the carrier power amplifier; an output impedance of the peak output matching circuit is $Z_p$, and a following formula is satisfied:

$Z_p=Z_L(n+1)/n$; and wherein the load modulation network is configured to perform power combination on an output signal of the carrier output matching circuit and an output signal of the peak input matching circuit, and is configured to set an impedance $Z_Q$ of a power amplifier combination point, wherein a resistance value of the impedance $Z_Q$ is $Z_L$.

2. The broadband Doherty power amplifier according to claim 1, wherein the resistance value $Z_L$ of the system load is 50 ohms.

3. The broadband Doherty power amplifier according to claim 2, wherein the power division ratio is 1:1.5, a resistance value of $Z_m$ is 125 ohms, a resistance value of $Z_p$ is 83.3 ohms, and the resistance value of the impedance $Z_Q$ is 50 ohms.

4. The broadband Doherty power amplifier according to claim 1, wherein the carrier power amplifier circuit is a class AB power amplifier.

5. The broadband Doherty power amplifier according to claim 4, wherein the carrier power amplifier circuit is implemented by a transistor.

6. The broadband Doherty power amplifier according to claim 1, wherein the peak power amplifier circuit is a class C power amplifier.

7. The broadband Doherty power amplifier according to claim 4, wherein the peak power amplifier circuit is implemented by a transistor.

8. The broadband Doherty power amplifier according to claim 1, wherein the power divider is an in-phase power divider or a phase quadrature power divider.

9. The broadband Doherty power amplifier according to claim 1, wherein the carrier input matching circuit and the peak input matching circuit each comprises a corresponding phase compensation circuit.

10. An implementation method for a broadband Doherty power amplifier, comprising:

S1. implementing a power divider to allocate power to a carrier power amplifier circuit and a peak power amplifier circuit according to a power division ratio of 1:n;

S2. implementing a carrier input matching circuit to match a terminal impedance of an input terminal of the carrier input matching circuit to an input impedance of a carrier power amplifier, and debugging a carrier output matching circuit to match a resistance value of a system load to an output impedance of the carrier power amplifier, where an output impedance of the carrier output matching circuit is $Z_m$, the resistance value of the system load is $Z_L$, and a following formula is satisfied:

$Z_m=Z_L(n+1)$; wherein $n$ is a positive number;

S3. implementing a peak input matching circuit to match a terminal impedance of an input terminal of the peak input matching circuit to an input impedance of the peak power amplifier, and debugging a peak output matching circuit to match the resistance value $Z_L$ of the system load to the output impedance of the carrier power amplifier, where an output impedance of the peak output matching circuit is $Z_p$, and a following formula being satisfied:

$Z_p=Z_L(n+1)/n$; and

S4. debugging a load modulation network to perform power combination on an output signal of the carrier output matching circuit and an output signal of the peak input matching circuit, and setting an impedance $Z_Q$ of a power amplifier combination point, where a resistance value of the impedance $Z_Q$ is $Z_L$;

wherein the broadband Doherty power amplifier comprises:

the power divider;

the carrier power amplifier circuit;

the peak power amplifier circuit; and the load modulation network;

an input terminal of the power divider serves as an input terminal of the broadband Doherty power amplifier; two output terminals of the power divider are respectively connected to an input terminal of the carrier power amplifier circuit and an input terminal of the peak power amplifier circuit; an output terminal of the carrier power amplifier circuit is connected to a first input terminal of the load modulation network; an output terminal of the peak power amplifier circuit is connected to a second input terminal of the load modulation network; and an output terminal of the load modulation network serves as an output terminal of the broadband Doherty power amplifier for connecting to a system load;

wherein the carrier power amplifier circuit comprises the carrier input matching circuit, the carrier power amplifier, and the carrier output matching circuit sequentially connected in series; the input terminal of the carrier input matching circuit is connected to a first one of the two output terminals of the power divider, and an output terminal of the carrier output matching circuit is connected to the first input terminal of the load modulation network; and wherein the peak power amplifier circuit comprises the peak input matching circuit, the peak power amplifier, and the peak output matching circuit sequentially connected in series; the input terminal of the peak input matching circuit is connected to a second one of the two output terminals of the power divider, and an output terminal of the peak output matching circuit is connected to the second input terminal of the load modulation network.

* * * * *